(12) United States Patent
Wang et al.

(10) Patent No.: US 11,527,589 B2
(45) Date of Patent: Dec. 13, 2022

(54) ENCAPSULATION STRUCTURE, DISPLAY PANEL AND MANUFACTURING METHOD THEREOF EACH HAVING EDGE ENCAPSULATION MEMBER ON EDGE OF ENCAPSULATION FILM

(71) Applicant: BOE TECHNOLOGY GROUP CO., LTD., Beijing (CN)

(72) Inventors: Wei Wang, Beijing (CN); Jingkai Ni, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 56 days.

(21) Appl. No.: 17/132,208

(22) Filed: Dec. 23, 2020

(65) Prior Publication Data
US 2021/0119180 A1     Apr. 22, 2021

Related U.S. Application Data

(63) Continuation of application No. 16/085,421, filed as application No. PCT/CN2018/074236 on Jan. 26, 2018, now Pat. No. 11,233,217.

(30) Foreign Application Priority Data

Jul. 24, 2017   (CN) .......................... 201710607002.0

(51) Int. Cl.
| | | |
|---|---|---|
| H01L 27/32 | (2006.01) | |
| H01L 51/52 | (2006.01) | |
| H01L 51/56 | (2006.01) | |

(52) U.S. Cl.
CPC ...... *H01L 27/3244* (2013.01); *H01L 51/5253* (2013.01); *H01L 51/56* (2013.01); *H01L 2227/323* (2013.01)

(58) Field of Classification Search
CPC .. H01L 51/5253; H01L 27/3244; H01L 51/56
See application file for complete search history.

(56) References Cited

U.S. PATENT DOCUMENTS

| 6,081,071 A | 6/2000 | Rogers |
|---|---|---|
| 2004/0251827 A1 | 12/2004 | Kang et al. |

(Continued)

FOREIGN PATENT DOCUMENTS

| CN | 2013-186984 A | 9/2013 |
|---|---|---|
| CN | 105374946 A | 3/2016 |

(Continued)

OTHER PUBLICATIONS

International Search Report of PCT/CN2018/074236 in Chinese, dated Apr. 26, 2018, with English translation.

(Continued)

*Primary Examiner* — Michael Jung
(74) *Attorney, Agent, or Firm* — Collard & Roe, P.C.

(57) ABSTRACT

An encapsulation structure, a display panel and a manufacturing method thereof are provided. The display panel includes a base substrate; a device to be encapsulated; an encapsulation film; and an edge encapsulation member; an orthographic projection of the edge encapsulation member on the base substrate overlaps with an orthographic projection of the edge of the encapsulation film on the base substrate; the encapsulation film includes a first film, a second film, and a third film, the second film is interposed between the first film and the third film, and the first film is in contact with the third film at an edge location to form a stacked-contact portion, and at least the stacked-contact portion of the encapsulation film is covered by the edge encapsulation member, and at the edge location, the edge encapsulation member and the second film have an overlapped part in a direction perpendicular to the base substrate.

19 Claims, 10 Drawing Sheets

(56) References Cited

U.S. PATENT DOCUMENTS

| | | |
|---|---|---|
| 2007/0172971 A1 | 7/2007 | Boroson |
| 2011/0235160 A1 | 9/2011 | Hsieh et al. |
| 2012/0287026 A1 | 11/2012 | Masuda |
| 2014/0183470 A1 | 7/2014 | Kim |
| 2015/0048329 A1 | 2/2015 | Kim |
| 2015/0221888 A1 | 8/2015 | Zhang |
| 2015/0221892 A1 | 8/2015 | Prushinskiy et al. |
| 2016/0190503 A1 | 6/2016 | Chang et al. |
| 2016/0285038 A1 | 9/2016 | Kim |
| 2016/0365398 A1 | 12/2016 | Kim et al. |
| 2017/0069873 A1 | 3/2017 | Kim et al. |
| 2017/0237038 A1* | 8/2017 | Kim .................... H01L 51/5253 257/40 |
| 2017/0294500 A1 | 10/2017 | Song et al. |
| 2018/0122890 A1 | 5/2018 | Park et al. |

FOREIGN PATENT DOCUMENTS

| | | |
|---|---|---|
| CN | 105374947 A | 3/2016 |
| CN | 105914224 A | 8/2016 |
| CN | 106601781 A | 4/2017 |
| CN | 106653818 A | 5/2017 |
| JP | 2001228806 A | 8/2001 |
| JP | 2003107519 A | 4/2003 |
| KR | 10-2015-0019380 A | 2/2015 |
| KR | 10-2016-0081106 A | 7/2016 |

OTHER PUBLICATIONS

Notice of Transmittal of the International Search Report of PCT/CN2018/074236 in Chinese, dated Apr. 26, 2018.
Written Opinion of the International Searching Authority of PCT/CN2018/074236 in Chinese, dated Apr. 26, 2018, with English translation.
Chinese Office Action in Chinese Application No. 201710607002.0, dated May 21, 2019 with English translation.
Korean Office Action in Korean Application No. 10-2018-7033433, dated Oct. 30, 2019 with English translation.
Office Action in U.S. Appl. No. 16/085,421 dated May 6, 2021.
Extended European Search Report in European Patent Application No. 18765791.1 dated Mar. 9, 2021 in English.
Japanese Office Action in Japanese Application No. 2018-549471 dated May 16, 2022 with English translation.

* cited by examiner

ENCAPSULATION STRUCTURE, DISPLAY PANEL AND MANUFACTURING METHOD THEREOF EACH HAVING EDGE ENCAPSULATION MEMBER ON EDGE OF ENCAPSULATION FILM

CROSS-REFERENCE TO RELATED APPLICATIONS

This application is a continuation application of U.S. patent application Ser. No. 16/085,421 filed on Sep. 14, 2018, which is a U.S. National Phase Entry of International Application No. PCT/CN2018/074236 filed on Jan. 26, 2018, designating the United States of America and claiming priority to Chinese Patent Application No. 201710607002.0, filed on Jul. 24, 2017. The present application claims priority to and the benefit of the above-identified applications and the above-identified applications are incorporated by reference herein in their entirety.

TECHNICAL FIELD

At least one embodiment of the present disclosure relates to an encapsulation structure, a display panel and a manufacturing method thereof.

BACKGROUND

Organic light-emitting diode (OLED) displays are one kind of organic electroluminescent devices with the advantages of simple manufacturing process, low costs, high luminescence efficiency and ease of forming flexible structure. Therefore, display technology utilizing organic light-emitting diodes has become an important display technology.

The encapsulation technique for OLED devices is an important factor to influence lifetime of the OLED devices. Thin film encapsulation (TIE) is a common encapsulation mode in OLED device encapsulation, which can satisfy the demand for OLED devices to be lighter and thinner, and attention has been focused thereon from researchers.

SUMMARY

At least one embodiment of the present disclosure relates to an encapsulation structure, a display panel and a manufacturing method thereof in order to increase yield and reliability of display panels.

At least one embodiment of the present disclosure provides a display panel, comprising: a base substrate; a device to be encapsulated on the base substrate; an encapsulation film on the base substrate, the encapsulation film covering the device to be encapsulated; and an edge encapsulation member on an edge of the encapsulation film, the edge encapsulation member being configured to cover the edge of the encapsulation film.

According to the display panel provided by one or more embodiments of the present disclosure, the edge encapsulation member is located at a periphery of the device to be encapsulated.

According to the display panel provided by one or more embodiments of the present disclosure, the edge encapsulation member is in a closed ring structure.

According to the display panel provided by one or more embodiments of the present disclosure, the edge encapsulation member comprises a hollowed-out structure, the edge encapsulation member has a first side close to the hollowed-out structure and a second side away from the hollowed-out structure, and an edge of the edge encapsulation member located on the second side is flush with the base substrate.

According to the display panel provided by one or more embodiments of the present disclosure, the edge encapsulation member is made of an organic material.

According to the display panel provided by one or more embodiments of the present disclosure, the encapsulation film comprises a first film, a second film and a third film which are sequentially away from the base substrate, the second film is interposed between the first film and the third film, and the first film is in contact with the third film at an edge location, and at least a stacked-contact portion between the first film and the third film is covered by the edge encapsulation member.

According to the display panel provided by one or more embodiments of the present disclosure, at the edge location, the edge encapsulation Member and the second film have an overlapped part in a direction perpendicular to the base substrate.

According to the display panel provided by one or more embodiments of the present disclosure, the first film and the third film comprise an inorganic film respectively, and the second film comprises an organic film.

According to the display panel provided by one or more embodiments of the present disclosure, the display panel further comprises a barrier, and the harrier is located on a side of the edge encapsulation member away from the encapsulation film.

According to the display panel provided by one or more embodiments of the present disclosure, an interval is provided between the barrier and the encapsulation film.

At least one embodiment of the present disclosure provides a method for manufacturing a display panel, comprising: forming a device to be encapsulated on a base substrate; forming an encapsulation film to cover the device to be encapsulated; and thrilling an edge encapsulation member on an edge of the encapsulation film, the edge encapsulation member being configured to cover the edge of the encapsulation film.

According to the method for manufacturing the display panel provided by one or more embodiments of the present disclosure, the edge encapsulation member is located at a periphery of the device to be encapsulated.

According to the method for manufacturing the display panel provided by one or more embodiments of the present disclosure, the edge encapsulation member is in a closed ring structure.

According to the method for manufacturing the display panel provided by one or more embodiments of the present disclosure, the edge encapsulation member is made of an organic material.

According to the method for manufacturing the display panel provided by one or more embodiments of the present disclosure, the encapsulation film comprises a first film, a second film and a third film which are sequentially away from the base substrate, the second film is interposed between the first film and the third film, and the first film is in contact with the third film at an edge location, and at least a stacked-contact portion between the first film and the third film is covered by the edge encapsulation member.

According to the method for manufacturing the display panel provided by one or more embodiments of the present disclosure, at the edge location, the edge encapsulation member and the second film have an overlapped part in a direction perpendicular to the base substrate.

According to the method for manufacturing the display panel provided by one or more embodiments of the present disclosure, the first film and the third film comprise an inorganic film respectively, and the second film comprises an organic film.

According to the method for manufacturing the display panel provided by one or more embodiments of the present disclosure, the method further comprises forming a barrier, and the barrier is located on a side of the edge encapsulation member away from the encapsulation film.

According to the method for manufacturing the display panel provided by one or more embodiments of the present disclosure, an interval is provided between the barrier and the encapsulation film.

According to the light-emitting diode display panel provided by one or more embodiments of the present disclosure, the light-emitting diode display panel comprises any one of the display panels described above.

At least one embodiment of the present disclosure provides an encapsulation structure, comprising: a base substrate; an encapsulation film on the base substrate, the encapsulation film being configured to encapsulate a device to be encapsulated on the base substrate; and an edge encapsulation ember on an edge of the encapsulation film, the edge encapsulation member being configured to cover an edge of the encapsulation film.

According to the encapsulation structure provided by one or more embodiments of the present disclosure, the edge encapsulation member is located at a periphery of the device to be encapsulated.

According to the encapsulation structure provided by one or more embodiments of the present disclosure, the edge encapsulation member is in a closed ring structure.

According to the encapsulation structure provided by one or more embodiments of the present disclosure, the edge encapsulation member comprises a hollowed-out structure, the edge encapsulation member has a first side close to the hollowed-out structure and a second side away from the hollowed-out structure, and an edge of the edge encapsulation member located on the second side is flush with the base substrate.

According to the encapsulation structure provided by one or more embodiments of the present disclosure, the encapsulation film comprises a first film, a second film and a third film which are sequentially away from the base substrate, the second film is interposed between the first film and the third film, and the first film is in contact with the third film at an edge location, and at least a stacked-contact portion between the first film and the third film is covered by the edge encapsulation member.

According to the encapsulation structure provided by one or more embodiments of the present disclosure, at the edge location, the edge encapsulation member and the second film have an overlapped part in a direction perpendicular to the base substrate.

According to the encapsulation structure provided by one or more embodiments of the present disclosure, the encapsulation structure further comprises a barrier located on the base substrate, and the barrier is located on a side of the edge encapsulation member away from the encapsulation film.

BRIEF DESCRIPTION OF THE DRAWINGS in order to clearly illustrate the technical solution of the embodiments of the disclosure, the drawing of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
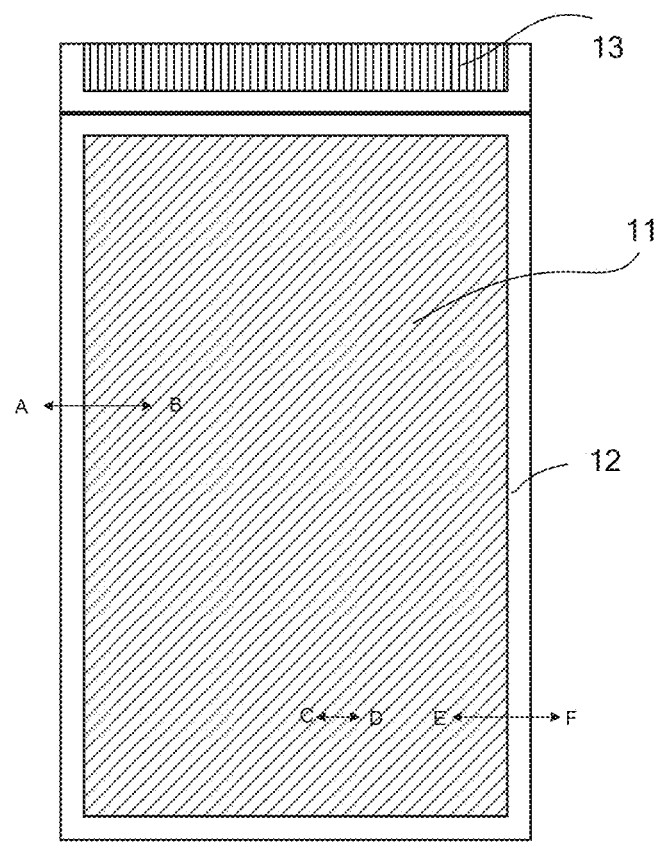
FIG. 1 is a top view of an OLED display panel.

FIG. 1 illustrates a top view of an OLED display panel. As illustrated in FIG. 1, the OLED display panel includes an encapsulation film covered region (protected region) 11, a non-protected region 12 and a bonding region 13. The non-protected region 12 is not covered by the encapsulation film and may be located at a periphery of the encapsulation film covered region 11. The bonding region 13 may be disposed on a side of the encapsulation film covered region 11.

Figure 2A:
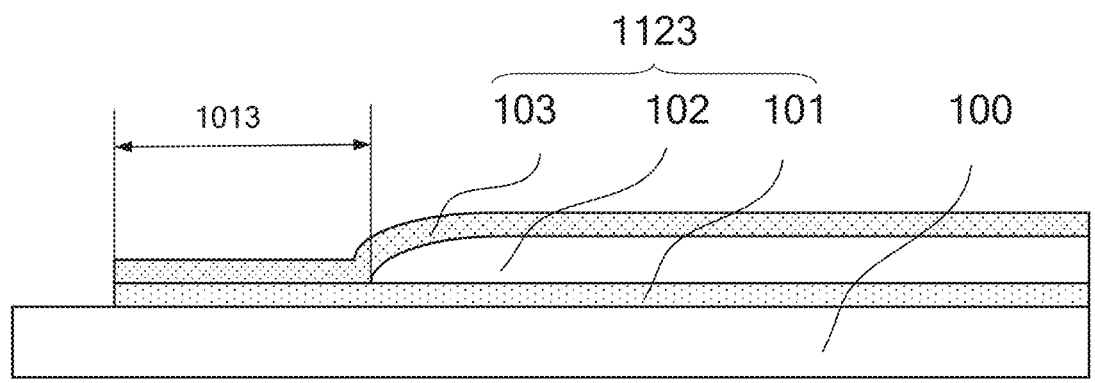
FIG. 2A is a cross-sectional view taken along line A-B in FIG. 1 (only illustrating an encapsulation film)

FIG. 2A is a cross-sectional view taken along line A-B in FIG. 1 (only illustrating an encapsulation film). As illustrated in FIG. 2A, art encapsulation film 1123 is disposed on the base substrate 100. The encapsulation film 1123 includes a first film 101, a second film 102 and a third film 103 which are sequentially away from the base substrate 100. The second film 102 is interposed between the first film 101 and the third film 103. The first film 101 is in contact with the third film 103 at an edge location. FIG. 2A illustrates a stacked-contact portion (stacked-contact position) 1013 between the first film 101 and the third film 103. For example, the first film 101 and the second film 103 may both be inorganic films, for example, made of an inorganic oxide such as SiNx, SiOx, SiOxNy or the like, but not limited thereto. For example, the second film 102 may be an organic film, for example, made of an organic material such as resin, but not limited thereto. The resin may be thermosetting resin including for example epoxy but not limited thereto. The resin may be for example thermoplastic resin including for example polymethyl methacrylate (PMMA) resin, but not limited thereto. For example, the first film 101 and the third film 103 may be fabricated with a chemical vapor deposition (CVD) method, and the second film 102 may be fabricated with an ink jet printing (IJP) method. The first film 101 and the third film 103 may both be water-impermeable layers. For example, the first film 101 may include a plurality of stacked sub-layers. The second film 102 and the third film 103 may also include a plurality of stacked sub-lavers, respectively, but are not limited thereto.

Figure 2B:
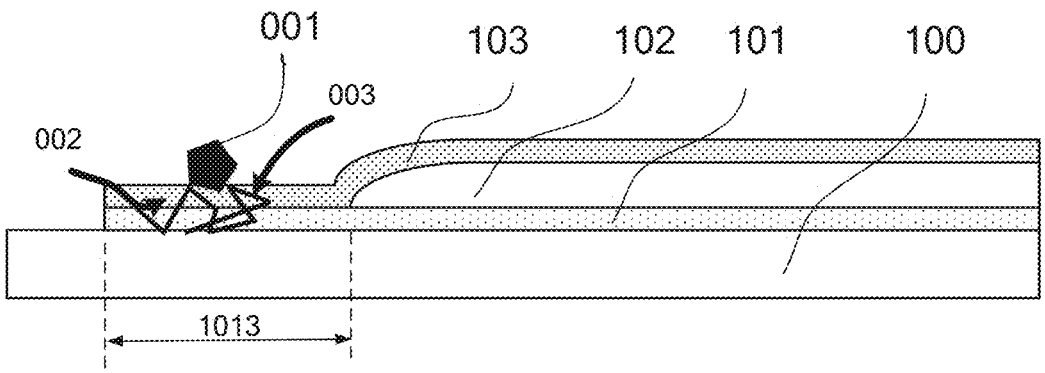
FIG. 2B is a schematic view of encapsulation failure caused by rupture of a stacked-contact portion by particles dropped thereon.

As illustrated in FIG. 2B, in a manufacturing process of an OLED display panel, particles 001 might drop off. Particles 001 that dropped on the stacked-contact portion 1013 tend to cause rupture of the stacked-contact portion 1013. Therefore, the OLED display panel is easily affected by moisture 002 and oxygen 003, which tends to impact the display panel and influence yield and reliability of the OLED display panel. For example, when particles dropping on edges, such as particles generated by laser cutting may cause rupture of the stacked-contact portion 1013 of the edge region in a pressing process, and resulting in the encapsulation failure.

Figure 3A:
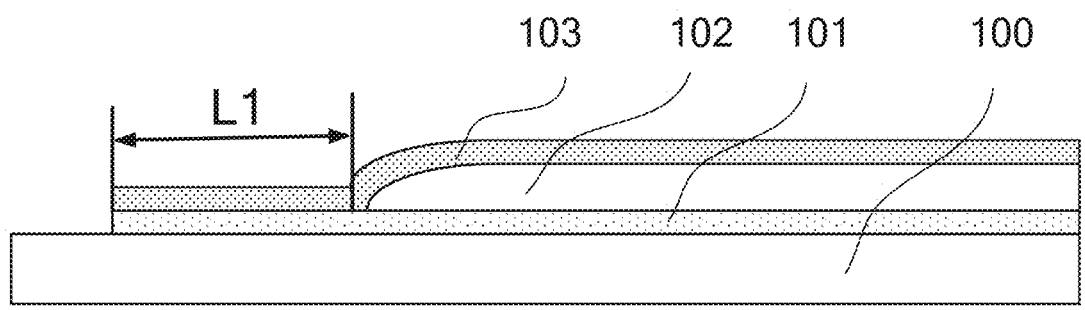
FIG. 3A is a stacked-contact portion with a smaller length in an OLED display panel.
Figure 3B:
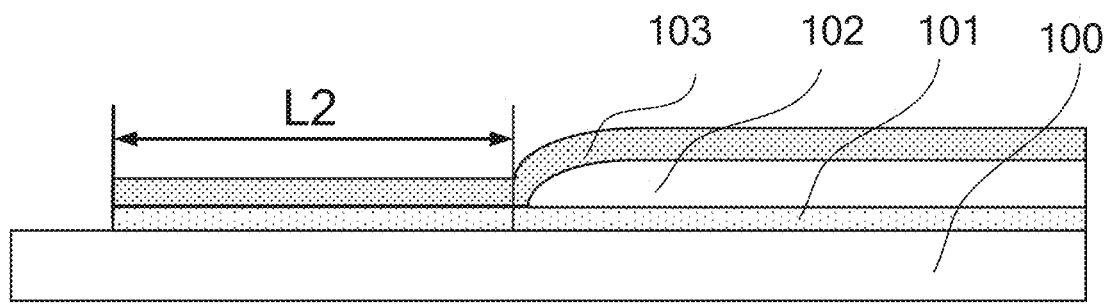
FIG. 3B is a stacked-contact portion with a larger length in an OLED display panel.

FIGS. 3A and 3B illustrate stacked-contact portions 1013 with different lengths. FIG. 3A illustrates a length L1 of the stacked-contact portion 1013. As illustrated in FIG. 3B, in order to increase encapsulation reliability, it is possible to increase the length of stacked-contact portion 1013 to L2 with L2>L1. However, increasing length of the stacked-contact portion 1013 also increases the probability for particles 001 to drop off on the stacked-contact portion 1013.

Figure 4A:
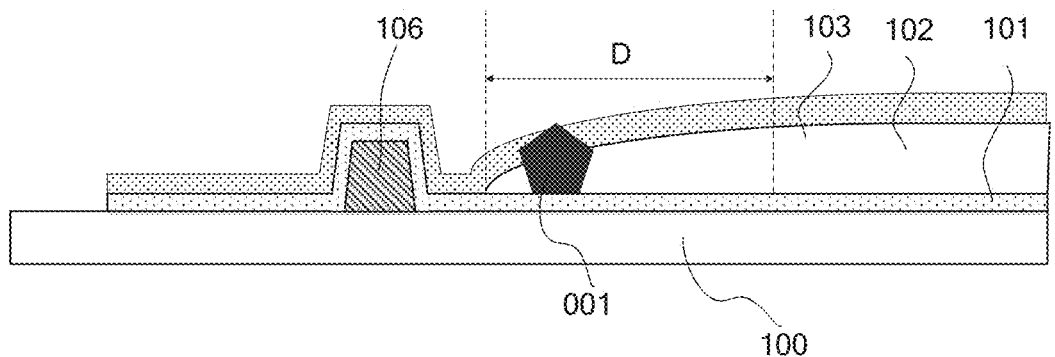
FIG. 4A is a schematic view of an OLED display panel with a first dam provided.

As illustrated in FIG. 4A, in order to facilitate manufacturing the second film 102 and/or increasing the effective length of the stacked-contact portion 1013, a first dam 106 may be provided. For example, the effective length refers to an actual length of the stacked-contact portion 1013. Increasing the effective length may facilitate elongating a path for water and oxygen to penetrate from an edge. FIG. 4A further illustrates a climbing distance D of the second film 102. The climbing distance D may be a distance from an edge to a location away from the edge for achieving a target height. The target height may be a thickness range available for the second film 102 in the display region. For example, the target height may be at a level of micrometers such as 4-15 μm but is not limited thereto. Because the second film has a small thickness at the climbing location, if particles 001 drop on the climbing location while fabricating the encapsulation film, it is easy to cause the OLED display panel to be defective, and it is easy to reduce the reliability.

Figure 4B:
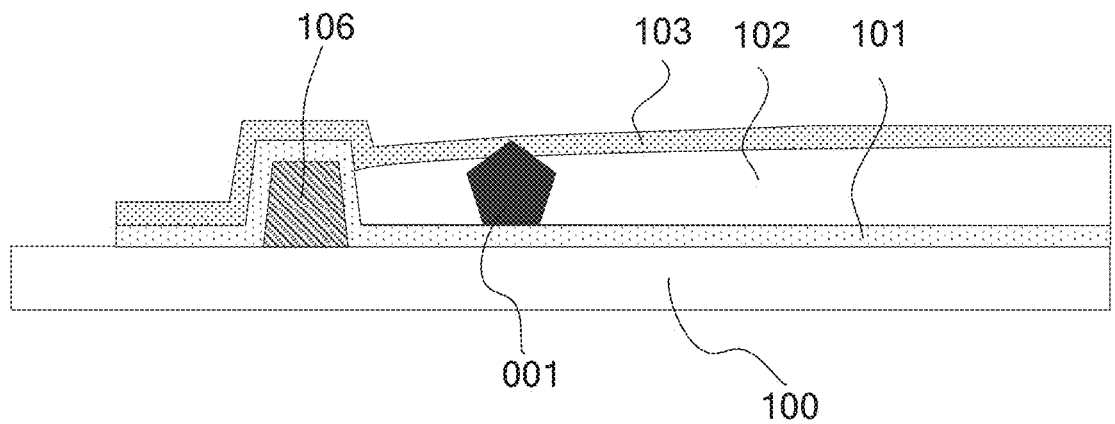
FIG. 4B is a schematic view of an OLED display panel in which an edge of the second film is closer to a first dam.

FIG. 4B illustrates the case in which an edge of the second film 102 is closer to the first a 106. In this case, the climbing distance can be reduced.

Figure 4C:
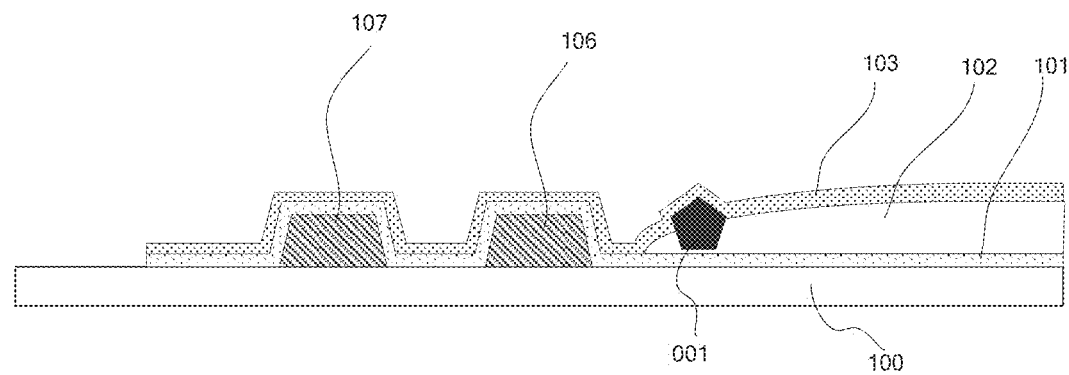
FIG. 4C is a schematic view of an OLED display panel with a second dam further provided.

FIG. 4C illustrates the case in which the OLED display panel further includes a second dam 107. The configuration of a plurality of dams can further increase the effective length of the stacked-contact portion 1013 and elongate the path for the water and oxygen to penetrate from edge.

Figure 5:
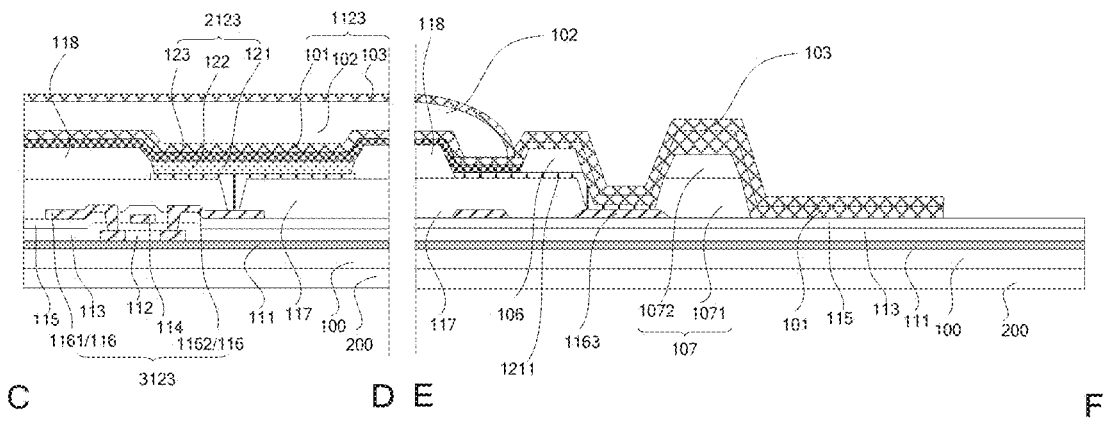
FIG. 5 is a cross-sectional view of an display panel, for example, is a cross-sectional view taken along lines C-D and E-F in FIG. 1.

FIG. 5 illustrates a cross-sectional view taken along lines C-D and E-F in FIG. 1. In some embodiments, the base substrate 100 is provided on a support substrate 200. The base substrate 100 may be a flexible substrate such as polyimide, (PI) but not limited thereto. The support substrate 200 may be a glass substrate but not limited thereto. An array of thin film transistors (TFTs) 3123 may be disposed on the base substrate 100 and FIG. 5 only illustrates one thin film transistor 3123. The thin film transistor 3123 may include a semiconductor layer, a gate electrode, a gate electrode insulation layer, a source electrode and a drain electrode.

As illustrated in FIG. 5, on the base substrate 100, there may be provided a buffer layer 111, a semiconductor layer 112, a gate electrode insulation layer 113, a gate electrode 114, an interlayer dielectric layer 115 and a source-drain electrode layer 116 in this order. The source-drain electrode layer 116 includes a source electrode 1161 and a drain electrode 1162 that are spaced apart from each other and may be connected with the semiconductor layer 112 through via holes respectively. A planarization layer 117 may be provided on the thin film transistor 3123 and a device to be encapsulated (OLEDs) 2123 may be provided on the planarization layer 117. The device to be encapsulated (OLED) 2123 may include a first electrode 121, a light-emitting functional layer 122 and a second electrode 123. The first electrode 121 may be electrically connected with the drain electrode 1162 through a via hole penetrating the planarization layer 117. A pixel definition layer 118 may be provided on the first electrode 121 to facilitate forming the light-emitting functional layer 122. The second electrode 123 may be electrically connected with the electrode line 1163 via a connection electrode 1211. The light-emitting functional layer 122 may include a light-emitting layer and other functional layers such as at least one selected from the group consisting of a hole injecting layer, a hole transporting layer, an electron transporting layer and an electron injecting layer but is not limited thereto. For example, the electrode line 1163 and the source-drain electrode layer 116 may be formed in the same layer to reduce manufacturing processes. An encapsulation film 1123 may be formed on the device to be encapsulated (OLEDs) 2123. The encapsulation film 1123 may be as described previously. The encapsulation film 1123 covers the device to be encapsulated 2123. The structure of the device to be encapsulated (OLED) 2123 is not limited thereto.

FIG. 5 further illustrates a first dam 106 and a second dam 107. The first dam 106 may be thrilled in the same layer as the pixel definition layer 118. The second dam 107 may include a first sub-dam 1071 and a second sub-dam 1072. For example, the first sub-dam 1071 may be formed in the same layer as the planarization layer 117, and the second sub-dam 1072 may be formed in the same layer as the pixel definition layer 118. Forming in the same layer may be in favor of reducing manufacturing processes.

Figure 6A:
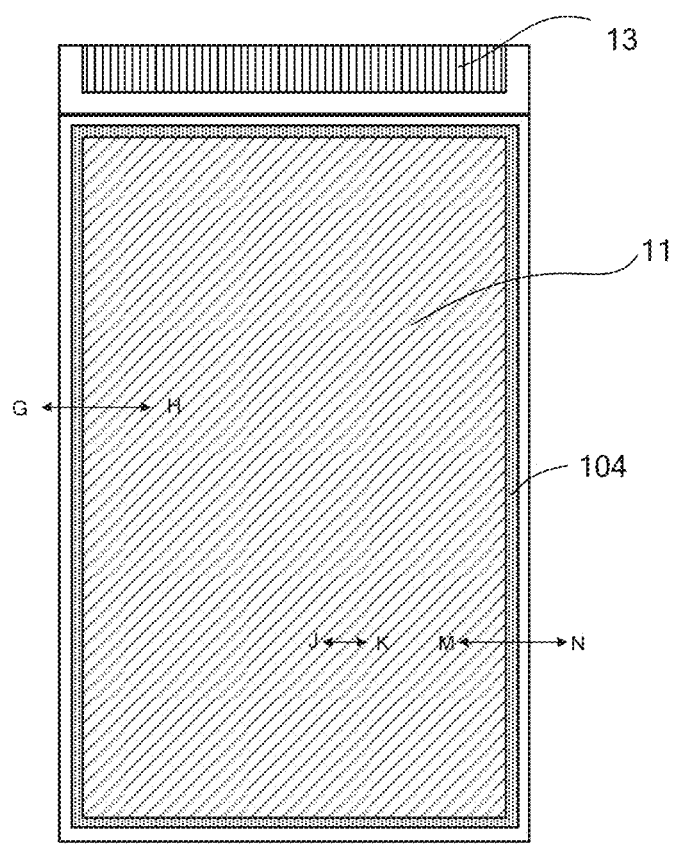
FIG. 6A is a top view of an OLED display panel/ encapsulation structure provided by an embodiment of the present disclosure.

FIG. 6A illustrates a top view of an OLED display panel/encapsulation structure provided by an embodiment of the present disclosure. The encapsulation structure of the OLED display panel further includes an edge encapsulation member 104 on an edge of the encapsulation film 1123. For example, as illustrated in FIG. 6A, the edge encapsulation member 104 may be in a closed ring structure. For example, the ring structure may include a rectangular ring, a circular ring etc. which is not limited herein. For example, a material (primary material) for the edge encapsulation member 104 may include an organic material including resin and silicon-containing organic colloid. For example, resin as primary material for the edge encapsulation member 104 may be thermosetting resin including for example but not limited to epoxy. Resin as primary material for the edge encapsulation member 104 may be thermoplastic resin including for example but not limited to PMMA resin. In additional to the above-described primary material, materials for the edge encapsulation member 104 may further include other auxiliary materials such as curing agent and leveling agent, but is not limited thereto. For example, the edge encapsulation member 104 may have a thickness of 4-15 μm, but is not limited thereto.

Figure 6B:
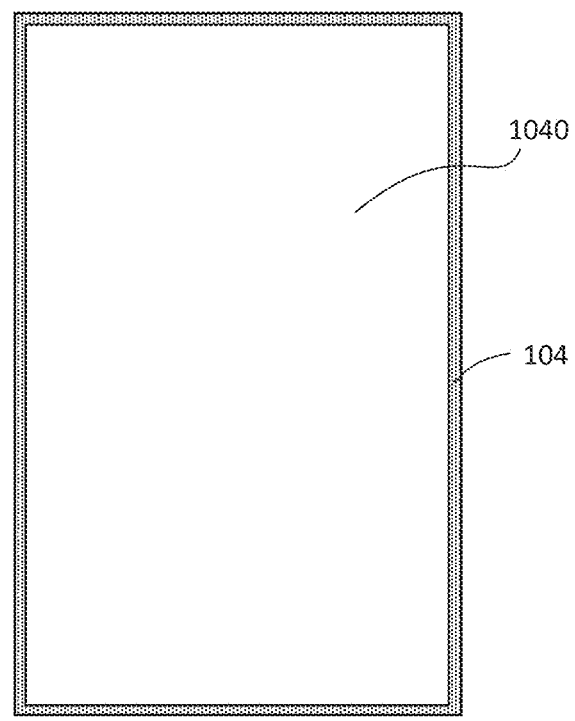
FIG. 6B is a top view of an edge encapsulation member provided by an embodiment of the present disclosure.

For example, as illustrated in FIG. 6B, the edge encapsulation member 104 has a hollowed-out structure 1040. That is, the edge encapsulation member 104 is located only on the edge of the encapsulation film 1123 and covers only the edge of the encapsulation film 1123. No edge encapsulation member 104 is provided on a central region of the encapsulation film 1123 (corresponding to the location of the hollowed-out structure 1040).

Due to the configuration of the edge encapsulation member 104, the stacked-contact portion 1013 is covered and protected by the edge encapsulation member 104. The edge of the encapsulation film 1123 is protected. Therefore, the stacked-contact portion 1013 is not easily ruptured even if particles are dropped on. It is also possible to avoid rupture at edge location due to uneven forces upon being pressed. Therefore, it is possible to improve yield and reliability of OLED display panels.

Figure 7A:
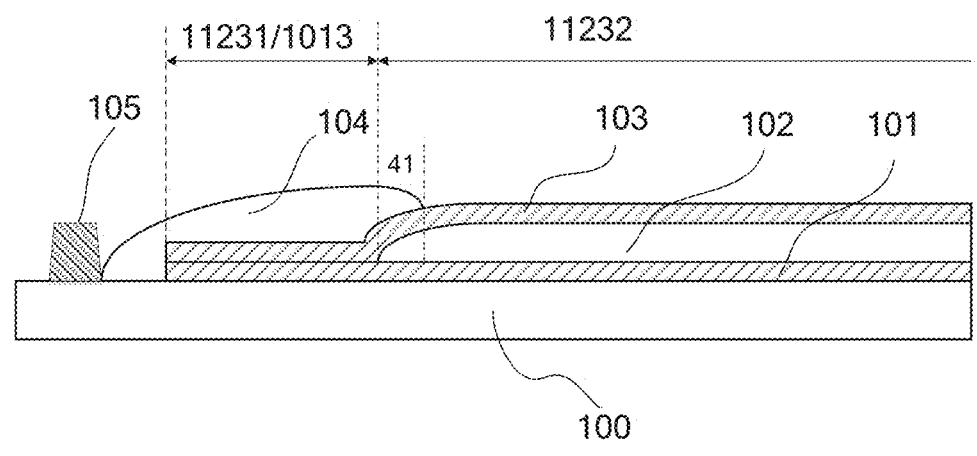
FIG. 7A is a cross-sectional view, taken along line G-H in FIG. 6A, provided by another embodiment of the present disclosure (only illustrating an encapsulation structure)

FIG. 7A is a cross-sectional view taken along line G-H in FIG. 6A (only illustrating an encapsulation structure). According to the display panel/encapsulation structure provided by one or more embodiments of the present disclosure, the edge encapsulation member 104 is located on the edge of the encapsulation film 1123. The encapsulation film 1123 may include the first film 101, the second film 102 and the third film 103 as described previously. The first film 101 is in contact with the third film 103 at an edge location. The edge encapsulation member 104 at least covers a stacked-contact portion between the first film 101 and the third film 103. For example, the stacked-contact portion 1013 may include at least two films for encapsulation. For example, the stacked-contact portion may be referred as a first thickness encapsulation film 11231. For example, in addition to the stacked-contact portion, other portions of the encapsulation film 1123 may be a second thickness encapsulation film 11232. The second thickness encapsulation film 11232 may include at least three films for encapsulation. For example, the second thickness encapsulation film 11232 is located inward the first thickness encapsulation film 11231. For example, the second thickness encapsulation film 11232 has a thickness greater than that of the first thickness encapsulation film 11231. For example, the second thickness encapsulation film 11232 may have different thicknesses at different locations. For example, the thickness of the second thickness encapsulation film nearby the stacked-contact portion may be smaller than the thickness of the second thickness encapsulation film nearby a center of the display panel. For example, the edge encapsulation member 104 at least covers (envelops) the first thickness encapsulation film 11231.

As illustrated in FIG. 7A, in order to facilitate defining the location and manufacturing the edge encapsulation member 104, the display panel/encapsulation structure may further include a barrier 105. The barrier 105 may be disposed on a side of the edge encapsulation member 104 away from the encapsulation film 1123. The barrier 105 may be made of an organic material such as resin but is not limited thereto.

Figure 7B:
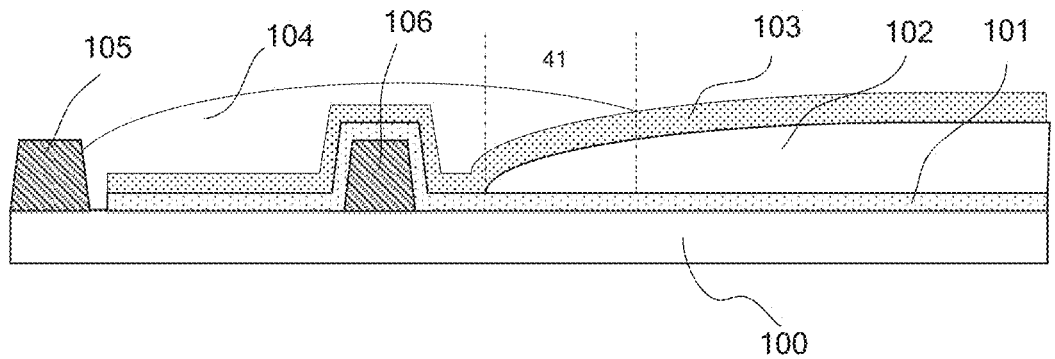
FIG. 7B is a cross-sectional view of an encapsulation structure provided by another embodiment of the present disclosure (a cross-sectional view taken along line G-H in FIG. 6A, only illustrating an encapsulation structure)

FIG. 7B illustrates a display panel/an encapsulation structure provided by another embodiment of the present disclosure, which is provided with a first dam 106 to increase the effective length of the stacked-contact portion 1013 as compared with the encapsulation structure illustrated in FIG. 7A. Due to the configuration of edge encapsulation member 104, the stacked-contact portion 1013 is covered by the edge encapsulation member 104. Therefore, the first dam 106 can be provided to obtain a stacked-contact portion 1013 with a large effective length. Therefore, even if particles are dropped off, the stacked-contact portion 1013 is not easily ruptured. Thereby, the edge encapsulation member 104 cooperates with the first dam 106 to further improve encapsulation reliability.

As illustrated in FIGS. 7A and 7B, according to the display panel/encapsulation structure provided by some embodiments of the present disclosure, in order to better protect an edge part of the encapsulation film, an interval may be provided between the barrier 105 and the encapsulation film 1123.

Figure 8:
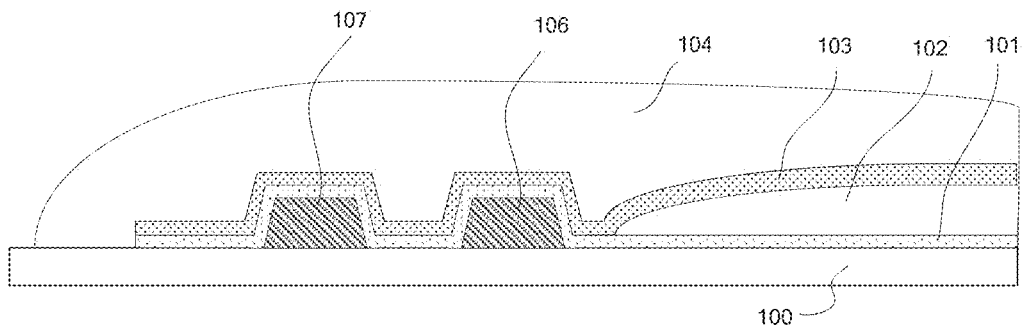
FIG. 8 is a cross-sectional view of a display panel/an encapsulation structure provided by another embodiment of the present disclosure.

FIG. 8 illustrates a display panel/an encapsulation structure provided by another embodiment of the present disclosure in which no barrier is provided to decrease manufacturing processes. As illustrated in FIG. 8, a second dam 107 may be provided. The second dam 107 is spaced apart from the first dam 106 and formed in the same layer as the first dam 106. The cooperation among the edge encapsulation member 104, the first dam 106 and the second dam 107 can further improve the encapsulation reliability.

Figure 9:
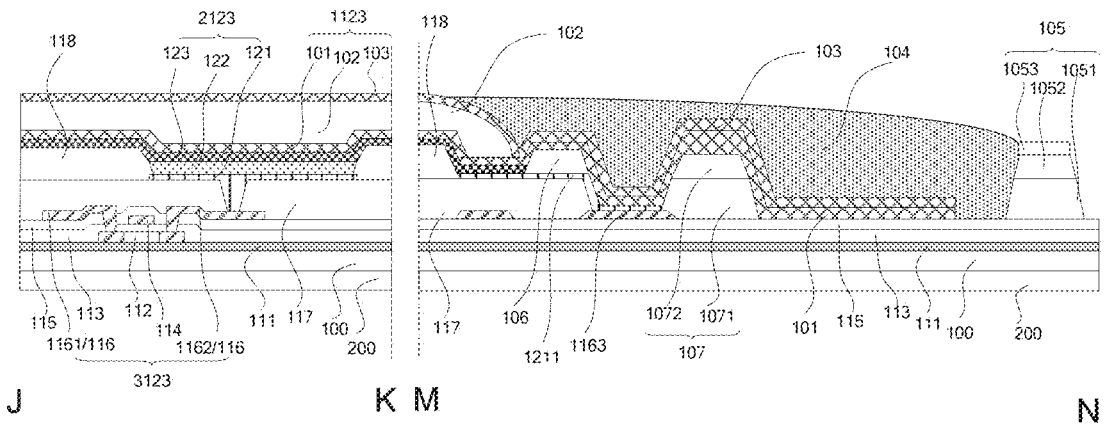
FIG. 9 is a cross-sectional view of an OLED display panel provided by another embodiment of the present disclosure (a cross-sectional view taken along lines J-K and M-N in FIG. 6A)

FIG. 9 illustrates a cross-sectional view taken along lines J-K and M-N in FIG. 6A. As compared with the structure illustrated in FIG. 5, an edge encapsulation member 104 and a barrier 105 are further provided. For example, the barrier 105 may include a plurality of sub-barriers, for example but not limited to a first sub-barrier 1051, a second sub-barrier 1052 and a third sub-barrier 1053. For example, the first sub-barrier 1051 may be formed in the same layer as the planarization layer 117, and the second sub-barrier 1052 may be formed in the same layer as the pixel definition layer 118, and the third sub-barrier 1053 may be formed in the same layer as a cell thickness support layer (PS). The cell thickness support layer is not illustrated in FIG. 9 and may be disposed on the encapsulation film 1123.

As illustrated in FIGS. 7A-7B and FIGS. 8-9, according to the display panel/encapsulation structure provided by one or more embodiments of the present disclosure, in order to better protect the edge part of the encapsulation film such as the climbing position, the edge encapsulation member 104 and the second film 102 have an overlapped part 41 at an edge location in a direction perpendicular to the base substrate 100. For example, the edge encapsulation member 104 and the second thickness encapsulation film 11232 have an overlapped part 41 at the edge location in the direction perpendicular to the base substrate 100.

As illustrated in FIG. 9, according to the display panel/encapsulation structure provided by one or more embodiments of the present disclosure, the edge encapsulation member 104 is located at a periphery of the device to be encapsulated 2123 to facilitate edge encapsulation. For example, the device to be encapsulated 2123 may include a plurality of devices. FIG. 9 illustrates only one device to be encapsulated 2123. By being located at the periphery of the device to be encapsulated 2123, it is meant that the device to be encapsulated 2123 is located within an area defined by an inner edge of the edge encapsulation member 104 in the direction perpendicular to the base substrate 100, but is not limited thereto. For example, the device to be encapsulated 2123 is located within the hollowed-out structure 1040 in the direction perpendicular to the base substrate 100, but is not limited thereto. For example, in the encapsulation structure, the encapsulation film 1123 is located on the base substrate 100 and configured to encapsulate the device to be encapsulated on the base substrate 100.

Figure 10:
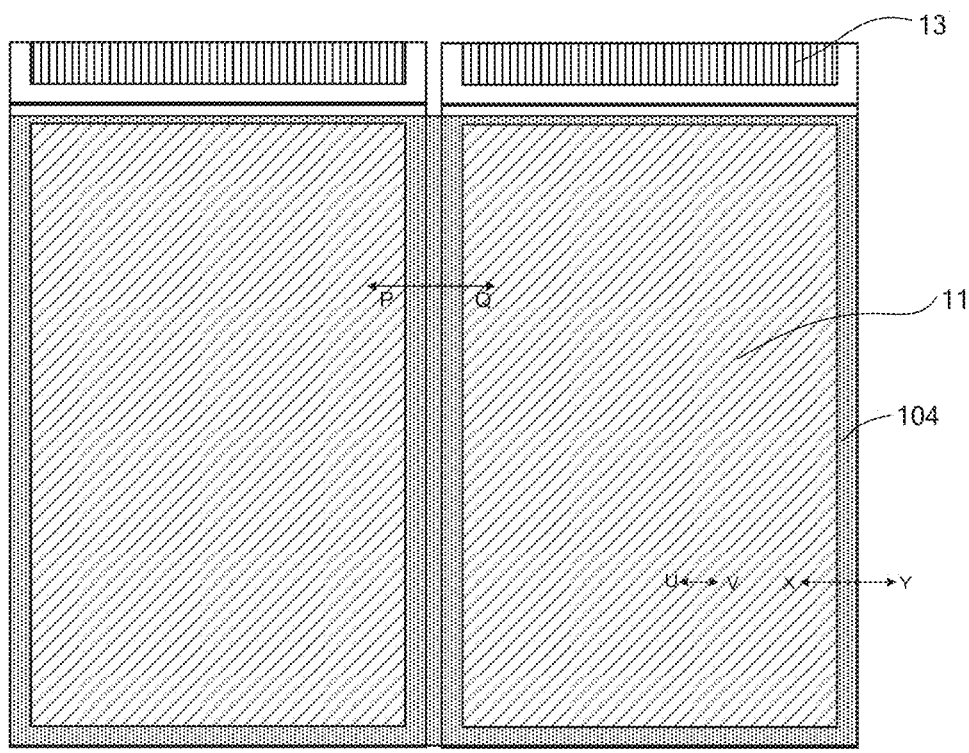
FIG. 10 is a schematic view of a mother board/an encapsulation structure of an OLED display panel provided by another embodiment of the present disclosure.

FIG. 10 illustrates a schematic view of a mother board/an encapsulation structure of an OLED display panel provided by one or more embodiments of the present disclosure. FIG. 10 illustrates two display panels. Single OLED display panels may be formed by way of cutting. The OLED display panel may also include the edge encapsulation member 104.

Figure 11:
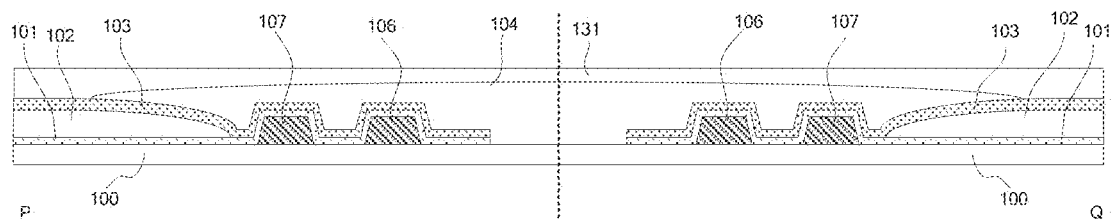
FIG. 11 is a cross-sectional view taken along line P-Q in FIG. 10.

FIG. 11 illustrates a cross-sectional view taken along line P-Q in FIG. 10. The display panel/encapsulation structure needs no barrier, which saves process and facilitates leveling while manufacturing the edge encapsulation member 104. Furthermore, edge encapsulation members of adjacent display panels may be separated at the laser cutting process. In this way, there is no need to consider fixed width while printing, thereby increasing edge covering thickness.

Figure 12:
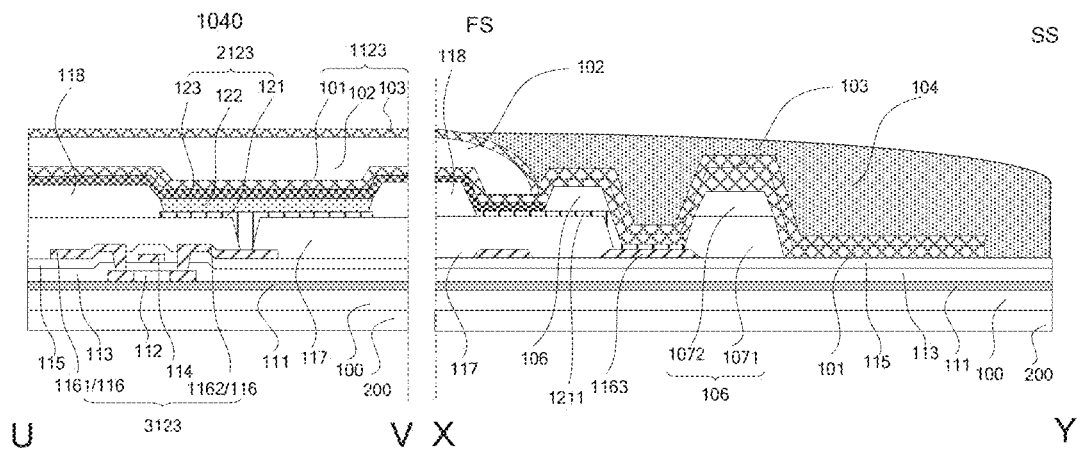
FIG. 12 is a cross-sectional view taken along lines U-V and X-Y in FIG. 10.

FIG. 12 illustrates a cross-sectional view taken along lines U-V and X-Y in FIG. 10. As compared with FIG. 9, no barrier 105 is provided. As illustrated in FIG. 12, an outer edge of the edge encapsulation member 104 is flush with the base substrate 100. For example, the outer edge of the edge encapsulation member 104 may refer to an edge of the edge encapsulation member 104 that is away from the hollowed-out structure 1040, and for another example, may refer to an edge of a display area or a central area away from the base substrate 100.

As illustrated in FIG. 12, the edge encapsulation member 104 has a first side FS that is close to the hollowed-out structure 1040 and a second side SS that is away from the hollowed-out 1040, and an edge of the edge encapsulation member 104 located on the second side SS is flush with the base substrate 100.

For example, as illustrated in FIGS. 13A-13F, a process flow for a flexible display product may include the following steps.

Figure 13A:
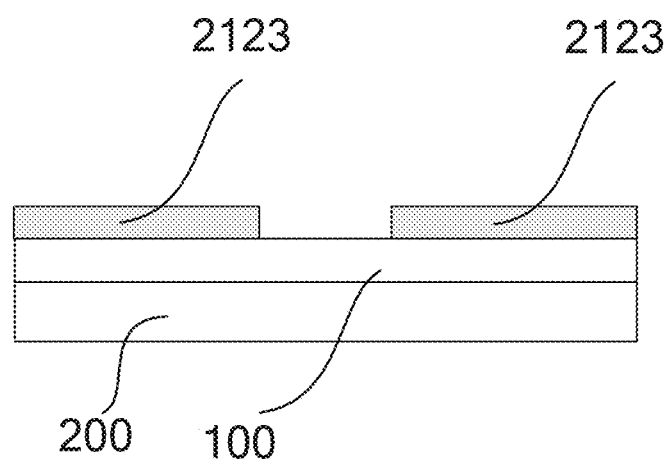
FIG. 13A is a schematic view of forming a device to be encapsulated on a base substrate on which TFTs arranged in an array have been formed in a method for manufacturing an OLED display panel.

In the first step, as illustrated in FIG. 13A, a device to be encapsulated 2123 (OLED devices) are manufactured on the base substrate 100. For example, the device to be encapsulated 2123 may be formed with an evaporation process or an ink jet printing process. The base substrate may be a flexible base substrate.

Figure 13B:
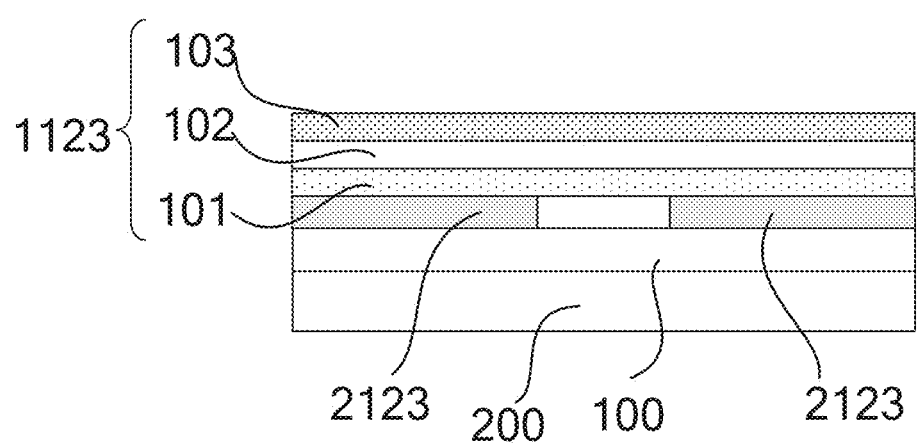
FIG. 13B is a schematic view of forming an encapsulation film on a device to be encapsulated in a method for manufacturing an OLED display panel.

In the second step, as illustrated in FIG. 13B, an OLED device is easily to be eroded by water and oxygen, the erosion is likely to cause failure of the OLED device, therefore, a TFE process is required to form the encapsulation film 1123. An encapsulation film 1123 being a tri-layer film is described as an example. The previous description may be referred to for the first film 101, the second film 102 and the third film 103.

Figure 13C:
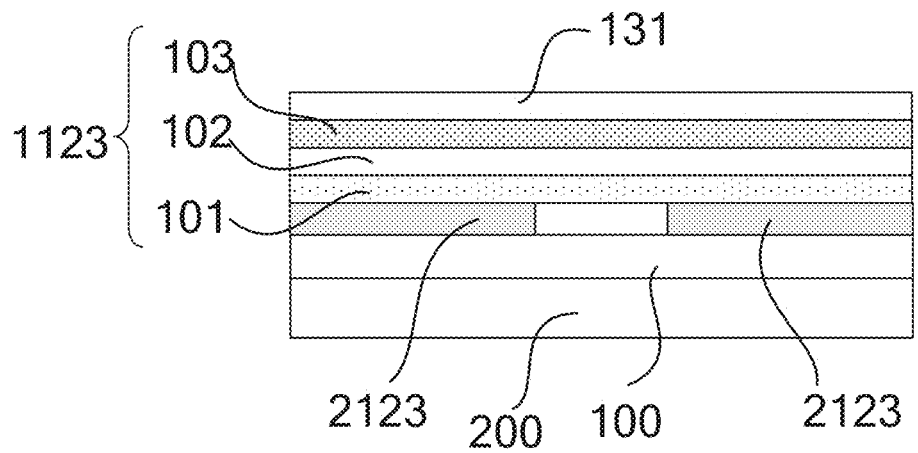
FIG. 13C is a schematic view of attaching a protection film onto an encapsulation film in a method for manufacturing an OLED display panel.

In the third step, as illustrated in FIG. 13C, a top protection film (TPF) 131 is attached onto the encapsulation film 1123 with a film attaching process. The top protection film 131 needs to cover the entire base substrate 100. The TPF 131 is provided to protect the encapsulation film 1123 in subsequent processes from being damaged. It also functions to keep the base substrate not to drop off the support substrate while separating the base substrate and the support substrate.

Figure 13D:
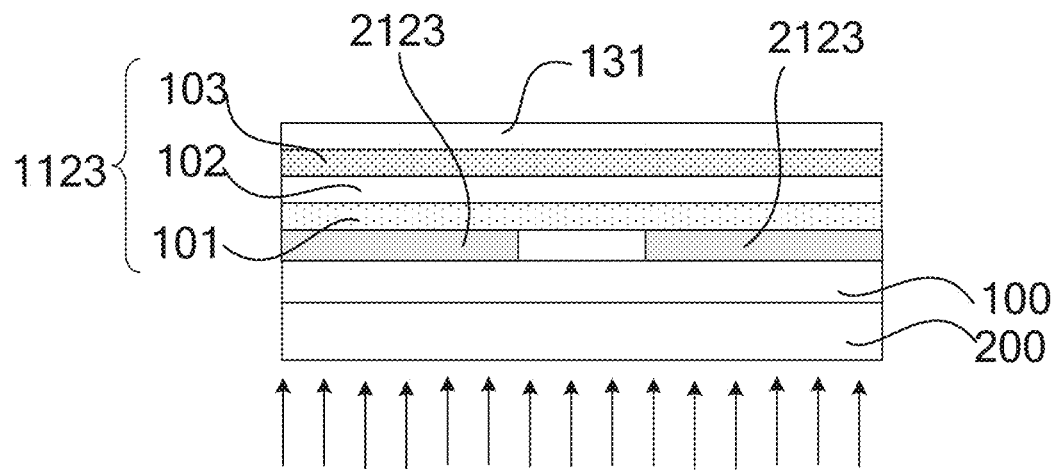
FIG. 13D is a schematic view of irradiating a side of a support substrate away from a base substrate with laser in a method for manufacturing an OLED display panel.

In the fourth step, as illustrated in FIG. 13D, laser is irradiated on a side of the support substrate 200 away from the base substrate 100 such that the laser is absorbed by the base substrate 100, the base substrate 100 is carbonized at the contact surface between the support substrate 200 and the base substrate 100, thereby separating the base substrate 100 and the support substrate 200.

Figure 13E:
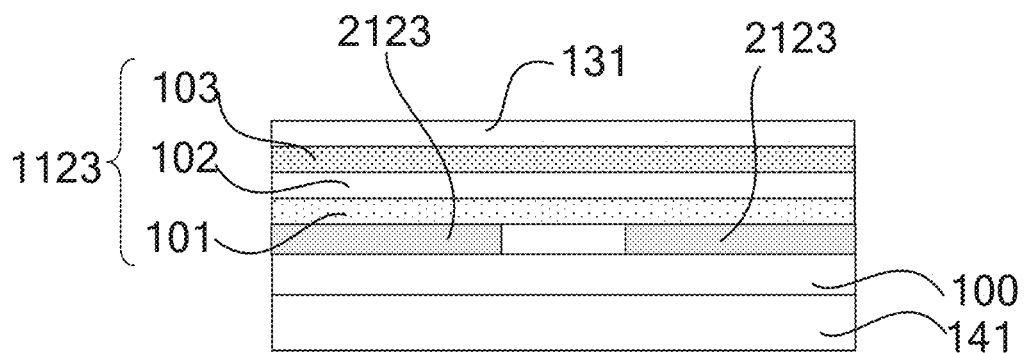
FIG. 13E is a schematic view of attaching a base film onto a side of a base substrate away from a device to be encapsulated after separating a support substrate and the base substrate in a method for manufacturing an OLED display panel.

In the fifth step, as illustrated in FIG. 13E, after separation, in order to protect the base substrate 100, a bottom film 141 may be attached on a side of the base substrate 100 away from the device to be encapsulated 2123 for protection.

Figure 13F:
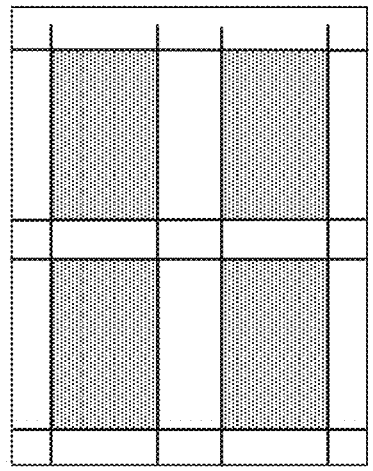
FIG. 13F is a schematic view of cutting the display panel mother board into display panels in a method for manufacturing an OLED display panel.

In the sixth step, as illustrated in FIG. 13F, the display panel motherboard is cut into small display panels. In FIG. 13F, forming 4 display panels will be described as an example.

In the seventh step, a subsequent module process is performed. For example, the subsequent module process may include removing the protection film on the display panel and performing subsequent processes. For example, the subsequent processes may include film attaching process.

In a method for manufacturing a display panel/an encapsulation structure provided by at least one embodiment of the present disclosure, a step of forming an edge encapsulation member 104 is further included. The edge encapsulation member 104 may be formed after forming the encapsulation film 1123. Then the step of attaching top protection film is performed. For example, the encapsulation film 1123 may be formed with an IJP process, a screen printing process or an edge coating process.

Figure 14:
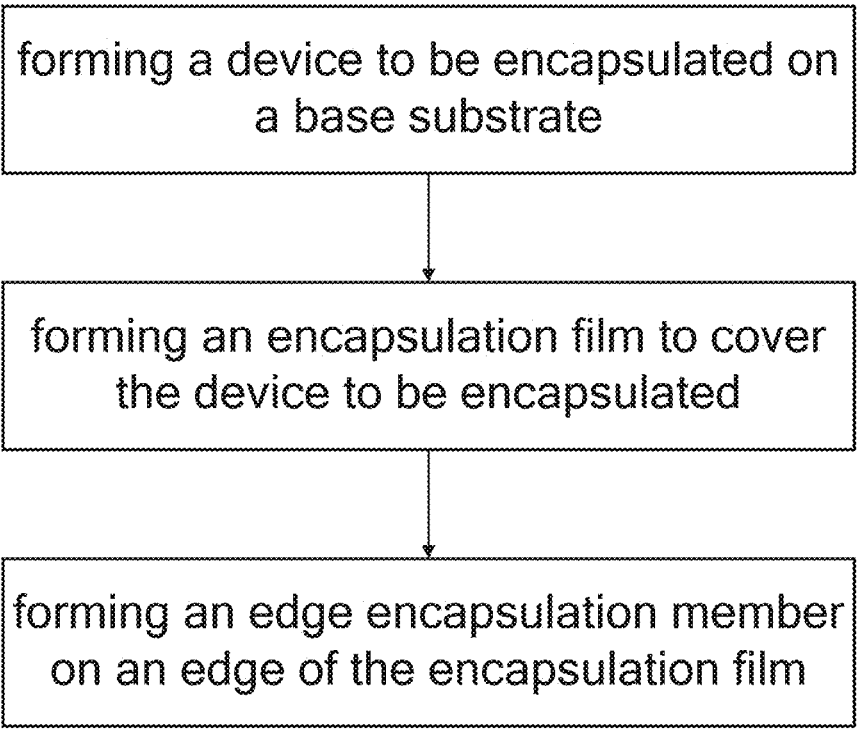
FIG. 14 is a diagram of a display panel/manufacturing method of an encapsulation structure provided by an embodiment of the present disclosure.

As illustrated in FIG. 14, a method for manufacturing a display panel/an encapsulation structure, provided by at least one embodiment of the present disclosure, includes: forming a device to be encapsulated 2123 on a base substrate 100; forming an encapsulation film 1123 to cover the device to be encapsulated 2123; and forming an edge encapsulation member 104 on an edge of the encapsulation film 1123.

According to the method for manufacturing a display panel/an encapsulation structure provided by an embodiment of the present disclosure, as illustrated in FIGS. 6A and 10, the edge encapsulation member 104 is in a closed ring structure. For example, the edge encapsulation member 104 is made of an organic material.

According to the method for manufacturing a display panel/an encapsulation structure provided by an embodiment of the present disclosure, as illustrated in FIGS. 7A-7B, 8-9 and 11-12, the edge encapsulation member 104 and the second film 102 have an overlapped part at the edge location in the direction perpendicular to the base substrate 100.

According to the method for manufacturing a display panel/an encapsulation structure provided by an embodiment of the present disclosure, as illustrated in FIGS. 7A and 7B, the method may further include forming a barrier 105. The barrier 105 is disposed on a side of the edge encapsulation member 104 away from the encapsulation film 1123 to facilitate manufacturing of the edge encapsulation member 104. For example, an interval is provided between the barrier 105 and the encapsulation film 1123. For example, the barrier 105 may be formed in the same layer as at least one selected from the group consisting of the planarization layer 117, the pixel definition layer 118 and the cell thickness support layer while manufacturing the OLED display panel so as to reduce manufacturing processes.

According to the method for manufacturing a display panel/an encapsulation structure provided by an embodiment of the present disclosure, as illustrated in FIGS. 9 and 12, the edge encapsulation member 104 is located at a periphery of the device to be encapsulated 2123.

According to the method for manufacturing a display panel/an encapsulation structure provided by an embodiment of the present disclosure, as illustrated in FIGS. 9 and 12, the encapsulation film 1123 includes a first film 101, a second film 102 and a third film 103 which are sequentially away from the base substrate 100, the second film 102 is interposed between the first film 101 and the third film 103. At an edge location, the first film 101 is in contact with the third film 103 and the edge encapsulation member 104 covers at least the stacked-contact portion between the first film 101 and the third film 103. For example, the first film 101 and the third film 103 are inorganic films and the second film 102 is an organic film.

Figure 15:
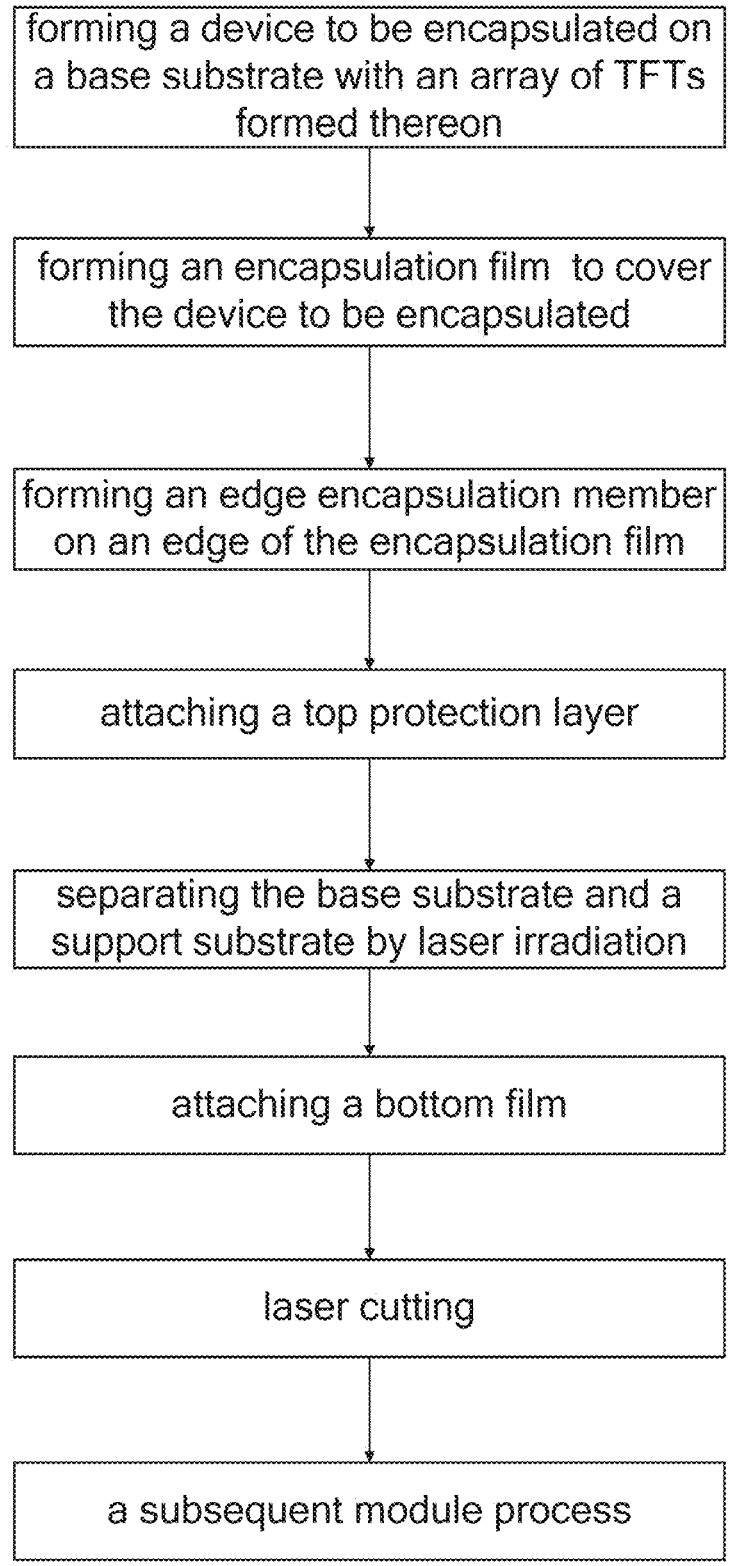
FIG. 15 is a diagram of a method for manufacturing a display panel/an encapsulation structure provided by an embodiment of the present disclosure.

FIG. 15 illustrates a diagram of a method for manufacturing a display panel/an encapsulation structure provided by an embodiment of the present disclosure. As compared with the manufacturing method illustrated in FIGS. 13A-13F, a step of manufacturing the edge encapsulation member is further provided.

At least one embodiment of the present disclosure provides a light-emitting diode display panel including any of the above-described encapsulation structures. For example, the light-emitting diode display panel may be a flexible panel.

In embodiments of the present disclosure, the encapsulation film including three layers of films is described as an example. However, the encapsulation film may further be other structures, for example, may further include more film layers. For example, a fourth film and a fifth film may be formed between the base substrate and the first film, the fourth film is closer to the base substrate than the fifth film, and the fourth film may be an inorganic film, and the fifth film may be an organic film. The number of films included in the encapsulation film is not limited to what have been described above. For example, the encapsulation film may be a structure of alternative organic films and inorganic films.

The following statements should be noted:

(1) Unless otherwise defined, the same reference numeral represents the same meaning in the embodiments of the disclosure and accompanying drawings.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(4) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display panel, comprising:
 a base substrate;
 a light-emitting device on the base substrate;
 an encapsulation film on the base substrate, the encapsulation film covering the light-emitting device; and
 an edge encapsulation member on an edge of the encapsulation film,
 wherein an orthographic projection of the edge encapsulation member on the base substrate overlaps with an orthographic projection of the edge of the encapsulation film on the base substrate, wherein the encapsulation film comprises a first film, a second film, and a third film which are sequentially away from the base substrate, the second film is interposed between the first film and the third film, and the first film is in contact with the third film at an edge location to form a stacked-contact portion, and at least the stacked-contact portion of the encapsulation film is covered by the edge encapsulation member, and wherein at the edge location, the edge encapsulation member and the second film have an overlapped part in a direction perpendicular to the base substrate;

the display panel further comprises a first dam at a periphery of the second film, wherein the stacked-contact portion is disposed on the first dam;

the display panel further comprises a second dam, wherein the first dam and the second dam are configured to increase an effective length of the stacked-contact portion, wherein the second dam is apart from the first dam, and the stacked-contact portion covers both the first dam and the second dam, and the edge encapsulation member covers both the first dam and the second dam.

2. The display panel according to claim 1, wherein the edge encapsulation member is located at a periphery of the light-emitting device.

3. The display panel according to claim 1, wherein the edge encapsulation member is in a closed ring structure.

4. The display panel according to claim 1, wherein the edge encapsulation member is made of an organic material.

5. The display panel according to claim 1, wherein the first film and the third film comprise an inorganic film respectively, and the second film comprises an organic film.

6. The display panel according to claim 1, wherein a side of the edge encapsulation member away from the light-emitting device is substantially flush with a side surface of the base substrate.

7. The display panel according to claim 1, wherein an interval is provided between a side of the stacked-contact portion away from the light-emitting device and a side of the edge encapsulation member away from the light-emitting device.

8. The display panel according to claim 1, wherein an interval is provided between a side of the stacked-contact portion away from the light-emitting device and a side surface of the base substrate.

9. The display panel according to claim 1, wherein an average thickness of the edge encapsulation member at a position close to the light-emitting device is less than that of the edge encapsulation member at a position away from the light-emitting device.

10. The display panel according to claim 1, wherein the edge encapsulation member has a thickness of 4-15 µm.

11. A display panel, comprising:
a base substrate;
a light-emitting device on the base substrate;
an encapsulation film on the base substrate, the encapsulation film covering the light-emitting device; and
an edge encapsulation member on an edge of the encapsulation film,
wherein an orthographic projection of the edge encapsulation member on the base substrate overlaps with an orthographic projection of the edge of the encapsulation film on the base substrate,
wherein the encapsulation film comprises a first film, a second film, and a third film which are sequentially away from the base substrate, the second film is interposed between the first film and the third film, and the first film is in contact with the third film at an edge location to form a stacked-contact portion, and at least the stacked-contact portion of the encapsulation film is covered by the edge encapsulation member, and wherein at the edge location, the edge encapsulation member and the second film have an overlapped part in a direction perpendicular to the base substrate;

wherein an upper surface of the stacked-contact portion comprises two adjacent convex surfaces and a concave surface between the two adjacent convex surfaces, the edge encapsulation member is disposed on both the two adjacent convex surfaces and the concave surface, and a thickness of a portion of the edge encapsulation member located directly above each of the two adjacent convex surfaces is smaller than a thickness of a portion of the edge encapsulation member located directly above the concave surface.

12. The display panel according to claim 11, further comprising a first dam at a periphery of the second film, wherein the stacked-contact portion is disposed on the first dam.

13. The display panel according to claim 12, wherein the light-emitting device is located in a display region, the edge encapsulation member is located in a periphery region, and the periphery region is located at a periphery of the display region.

14. The display panel according to claim 13, wherein the second film comprises a first portion located in the display region and a second portion located in the periphery region, and the first portion of the second film is higher than the first dam.

15. The display panel according to claim 13, wherein the second film comprises a first portion located in the display region and a second portion located in the periphery region, and a distance between a top surface of the first dam and the base substrate is less than a distance between a top surface of the first portion and the base substrate.

16. The display panel according to claim 13, wherein a boundary of the edge encapsulation member close to the display region is located between the first dam and the light-emitting device.

17. The display panel according to claim 12, wherein a boundary of the edge encapsulation member close to the light-emitting device is located between the first dam and the light-emitting device.

18. The display panel according to claim 12, wherein no structure is provided at a side of the edge encapsulation member away from the light-emitting device.

19. A display panel, comprising:
a base substrate;
a light-emitting device on the base substrate;
an encapsulation film on the base substrate, the encapsulation film covering the light-emitting device; and
an edge encapsulation member on an edge of the encapsulation film,
wherein an orthographic projection of the edge encapsulation member on the base substrate overlaps with an orthographic projection of the edge of the encapsulation film on the base substrate,
wherein the encapsulation film comprises a first film, a second film, and a third film which are sequentially away from the base substrate, the second film is interposed between the first film and the third film, and the first film is in contact with the third film at an edge location to form a stacked-contact portion, and at least the stacked-contact portion of the encapsulation film is covered by the edge encapsulation member, and wherein at the edge location, the edge encapsulation member and the second film have an overlapped part in a direction perpendicular to the base substrate;

wherein an upper surface of the stacked-contact portion comprises two adjacent convex surfaces and a concave surface between the two adjacent convex surfaces, the edge encapsulation member is disposed on both the two adjacent convex surfaces and the concave surface, and a thickness of a portion of the edge encapsulation member located directly above each of the two adjacent convex surfaces is smaller than a thickness of a portion of the edge encapsulation member located directly above the concave surface;

wherein a distance from an upper surface of the portion of the edge encapsulation member located directly above the convex surface to the base substrate is substantially the same as a distance from an upper surface of the portion of the edge encapsulation member located directly above the concave surface to the base substrate.

\* \* \* \* \*